United States Patent
Yasui et al.

(10) Patent No.: US 9,857,483 B2
(45) Date of Patent: Jan. 2, 2018

(54) RADIATION DETECTOR AND RADIATION DETECTION APPARATUS

(71) Applicant: HORIBA, Ltd., Kyoto-shi, Kyoto (JP)

(72) Inventors: Kengo Yasui, Kyoto (JP); Kazutaka Okamoto, Kyoto (JP); Shuji Takada, Kyoto (JP)

(73) Assignee: HORIBA, LTD., Kyoto (JP)

( * ) Notice: Subject to any disclaimer, the term of this patent is extended or adjusted under 35 U.S.C. 154(b) by 0 days.

(21) Appl. No.: 15/135,676

(22) Filed: Apr. 22, 2016

(65) Prior Publication Data

US 2016/0313455 A1    Oct. 27, 2016

(30) Foreign Application Priority Data

Apr. 23, 2015   (JP) ................ 2015-088547
Apr. 19, 2016   (JP) ................ 2016-083921

(51) Int. Cl.
*H01J 37/244*    (2006.01)
*G01T 1/24*    (2006.01)

(52) U.S. Cl.
CPC .......... *G01T 1/244* (2013.01); *H01J 37/244* (2013.01); *H01J 2237/2442* (2013.01)

(58) Field of Classification Search
CPC .............. G01T 1/244; H01J 37/244
See application file for complete search history.

(56) References Cited

U.S. PATENT DOCUMENTS

| 3,192,725 | A | † | 7/1965 | Britton | |
|---|---|---|---|---|---|
| 4,245,479 | A | | 1/1981 | Richter, Jr. et al. | |
| 5,903,004 | A | † | 5/1999 | Koshihara | |
| 6,396,061 | B1 | * | 5/2002 | Madden | G01J 5/061 |
| | | | | | 250/339.03 |
| 2007/0114429 | A1 | | 5/2007 | Bhadare | |
| 2007/0267577 | A1 | * | 11/2007 | Kindem | G01T 1/2018 |
| | | | | | 250/370.15 |
| 2011/0139987 | A1 | † | 6/2011 | Kroemer | |

(Continued)

FOREIGN PATENT DOCUMENTS

| EP | 1790998 A2 | 5/2007 |
|---|---|---|
| JP | 2007071708 A | 3/2007 |

(Continued)

OTHER PUBLICATIONS

Machine translation of JP-2007-071708A (22 pages).

(Continued)

*Primary Examiner* — Mark R Gaworecki
(74) *Attorney, Agent, or Firm* — Robert P. Michael, Esq.; Carter, DeLuca, Farrell & Schmidt LLP

(57) ABSTRACT

A radiation detector 1 includes a Peltier device (electronic cooling unit) for cooling a radiation detecting element, and the heat releasing part of the Peltier device is in thermal contact with a cold finger (thermally conductive part). The cold finger is made of a material with higher thermal conductivity than that of the base, and penetrates the base. The heat from the radiation detecting element is conducted from the heat releasing part of the Peltier device to the cold finger, and is dissipated to the outside of the radiation detector through the cold finger. As such, heat is efficiently dissipated from the radiation detecting element.

4 Claims, 5 Drawing Sheets

(56) References Cited

U.S. PATENT DOCUMENTS

| | | | | |
|---|---|---|---|---|
| 2012/0140472 A1* | 6/2012 | Naegele | ................... | G01J 1/08 |
| | | | | 362/249.02 |
| 2012/0187297 A1* | 7/2012 | Mullins | ................... | G01J 5/061 |
| | | | | 250/352 |
| 2015/0021477 A1* | 1/2015 | Cassaigne | ............... | G01J 5/061 |
| | | | | 250/338.1 |

FOREIGN PATENT DOCUMENTS

| | | | |
|---|---|---|---|
| JP | 2007147595 A | 6/2007 | |
| JP | 2008128635 A | 6/2008 | |

OTHER PUBLICATIONS

Machine translation of JP-2008-128635A (11 pages).
Search Report under Section 17(5) issued by the United Kingdom Intellectual Property Office in relation to United Kingdom Application No. GB1606947.8 dated Oct. 31, 2016 (3 pages).

\* cited by examiner
† cited by third party

F I G. 2
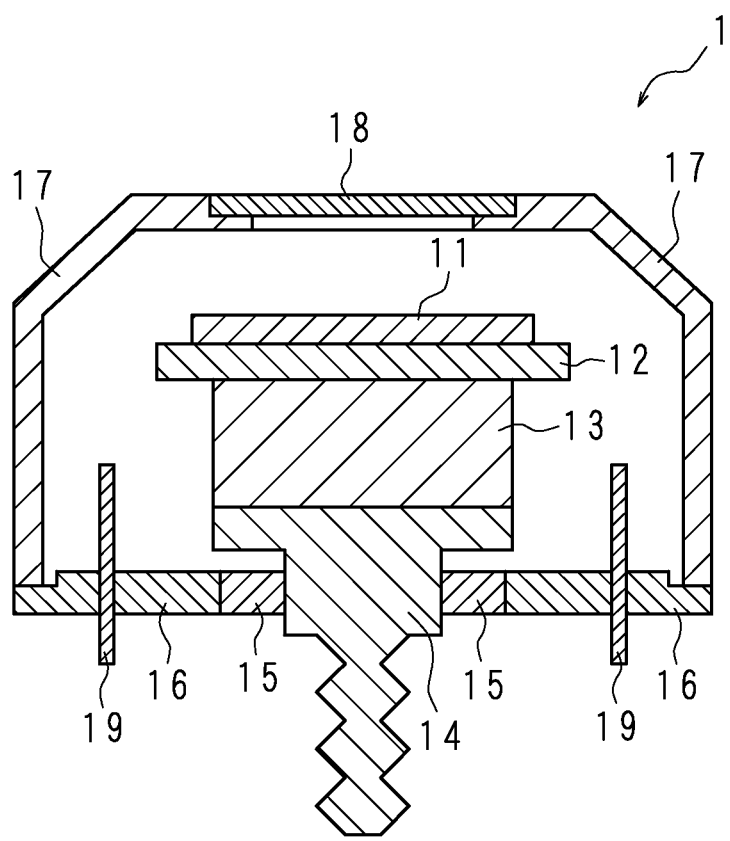

RADIATION DETECTOR AND RADIATION DETECTION APPARATUS

CROSS-REFERENCE TO RELATED APPLICATIONS

This Nonprovisional application claims priority under 35 U.S.C. §119(a) on Patent Application No. 2015-088547 filed in Japan on Apr. 23, 2015, and on Patent Application No. 2016-083921 filed in Japan on Apr. 19, 2016, the entire contents of which are hereby incorporated by reference.

BACKGROUND

1. Technical Field

The present invention relates to a radiation detector employing a radiation detecting element made of a semiconductor, and to a radiation detection apparatus.

2. Description of Related Art

An example radiation detector for detecting radiation such as X-ray detects radiation with the use of a radiation detecting element made of a semiconductor. The radiation detecting element may be cooled for use in order to enhance the sensitivity in detection. For example, a Peltier device is used for cooling. In the radiation detector using a Peltier device, the heat releasing part of the Peltier device is joined to the base made of metal, whereas the heat absorbing part of the Peltier device is joined to a wiring board on which the radiation detecting element is mounted.

The radiation detector includes a cover made of metal joined to a base, and is tightly sealed. Heat from the radiation detecting element is conducted from the Peltier device to the base, and is dissipated through the base to the outside. The radiation detector having such a configuration is described in Japanese Patent Application Laid-Open No. 2007-147595.

SUMMARY OF THE INVENTION

In the conventional radiation detector, the base is mainly constituted by iron. The radiation detecting element has low heat dissipating performance because iron has a relatively low thermal conductivity. Moreover, external heat may be transferred to the inside of the radiation detector through the base, where the temperature on the heat releasing part of the Peltier device is raised while the heat dissipating performance is lowered. The low heat dissipating performance raises the temperature of the radiation detecting element and deteriorates the sensitivity in detecting radiation. If the radiation detecting element is to be sufficiently cooled while the heat dissipating performance is low, the Peltier device will have increased power consumption.

The present invention has been made in view of the circumstances described above, and aims to provide a radiation detector and a radiation detection apparatus that can efficiently dissipate heat from a radiation detecting element.

A radiation detector according to the present invention comprises a radiation detecting element, an electronic cooling unit for cooling the radiation detecting element, a housing in which the radiation detecting element and the electronic cooling unit are accommodated, further comprising, and a thermally conductive part which is in thermal contact with a heat releasing part of the electronic cooling unit. The thermally conductive part is made of a material with a thermal conductivity higher than a thermal conductivity of the housing, and penetrates the housing so that a part of the thermally conductive part protrudes to an outside of the housing.

The radiation detector according to the present invention further comprises a low conductivity material having a thermal conductivity lower than the thermal conductivity of the housing, which is disposed between the housing and the thermally conductive part.

In the radiation detector according to the present invention, a portion of the housing that is in contact with the thermally conductive part is made of a material with a conductivity lower than a conductivity of iron.

A radiation detection apparatus according to the present invention comprises the radiation detector according to the present invention that outputs a signal in accordance with energy of detected radiation; and a signal processing unit for generating a spectrum of the radiation based on a signal output by the radiation detector.

According to the present invention, the radiation detector includes a thermally conductive part which is in thermal contact with the heat releasing portion of the electronic cooling unit for cooling the radiation detecting element. The thermally conductive part is formed with material having a thermal conductivity higher than that of the housing of the radiation detector, and penetrates the housing. The heat of the radiation detecting element is conducted from the heat releasing portion of the electronic cooling unit to the thermally conductive part, and is dissipated through the thermally conductive part to the outside of the radiation detector. Since the thermally conductive part has a high thermal conductivity, the radiation detecting element has high heat dissipating performance.

Furthermore, in the present invention, the radiation detector includes a low thermal conductivity material arranged between the thermally conductive part and the housing. Because of the low thermal conductivity material, it is difficult for heat to be conducted from the housing to the thermally conductive part. This suppresses the transfer of heat in the outside of the radiation detector to the inside of the radiation detector through the housing.

According to the present invention, the portion of the housing which is in contact with the thermally conductive part is formed with a material having a thermal conductivity lower than that of iron. This makes it difficult for heat to be conducted from the housing to the thermally conductive part, thereby suppressing the transfer of heat in the outside of the radiation detector to the inside of the radiation detector through the housing.

According to the present invention, in the radiation detector, the radiation detecting element is sufficiently cooled since it has high heat dissipating performance. This lowers the leak current in the radiation detecting element and increases the energy resolution in detecting radiation. The present invention therefore produces beneficial effects which, for example, allow the radiation detection apparatus to detect radiation with high sensitivity and to suppress power required for cooling the radiation detecting element.

The above and further objects and features of the invention will more fully be apparent from the following detailed description with accompanying drawings.

BRIEF DESCRIPTION OF SEVERAL VIEWS OF THE DRAWINGS

FIG. 2 is a schematic section view of a radiation detector according to Embodiment 1;

DETAILED DESCRIPTION

The present invention will specifically be described below with reference to the drawings illustrating the embodiments thereof.

Embodiment 1

Figure 1:
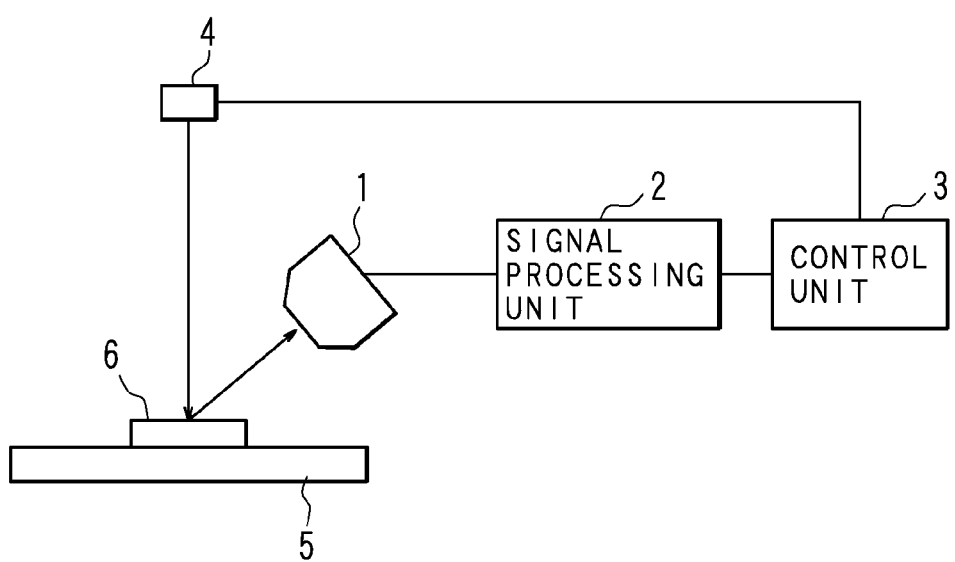
FIG. 1 is a block diagram illustrating the configuration of a radiation detection apparatus.

FIG. 1 is a block diagram illustrating the configuration of a radiation detection apparatus. The radiation detection apparatus is, for example, an X-ray fluorescence spectrometer. The radiation detection apparatus includes a radiation source 4 irradiating a sample 6 with radiation such as electron beam or X-ray, a sample table 5 on which the sample 6 is mounted, and a radiation detector 1. The radiation source 4 irradiates the sample 6 with radiation, which generates radiation such as X-ray fluorescence at the sample 6, and the radiation detector 1 detects the radiation emitted from the sample 6. In FIG. 1, the radiation is indicated by arrows. The radiation detector 1 outputs a signal proportional to the energy of the detected radiation. The radiation detector 1 is connected to a signal processing unit 2 for processing a signal output from the radiation detector 1. The signal processing unit 2 counts signals of different values output from the radiation detector 1, to generate a relationship between the energy of radiation and the counted number, i.e. the spectrum of radiation. The signal processing unit 2 and the radiation source 4 are connected to the control unit 3 for controlling the entire radiation detection apparatus. The control unit 3 controls the operations of the signal processing unit 2 and the radiation source 4.

FIG. 2 is a schematic section view of the radiation detector 1 according to Embodiment 1. The radiation detector 1 includes a plate-like base 16. A cap-shaped cover 17 is placed over one surface side of the base 16. The cover 17 has a shape formed by connecting a truncated cone to one end of a cylinder, the other end of the cylinder being joined to the base 16. The base 16 and the cover 17 are welded together. The base 16 and the cover 17 are made of iron, nickel or kovar so as to be easily welded by resistance welding. The truncated head at the top end of the cover 17 is provided with a window 18 made of a material which allows radiation to pass therethrough, such as beryllium. Inside the cover 17 is tightly sealed, and is depressurized or filled with inert gas. The base 16 and cover 17 correspond to the housing in the present invention.

Inside the cover 17, a radiation detecting element 11 made of a semiconductor, a wiring board 12 and a Peltier device (electronic cooling unit) 13 are disposed. The radiation detecting element 11 is, for example, a silicon drift detector (SDD). The radiation detecting element 11 is mounted on the surface of the wiring board 12 and is disposed at the position opposed to the window 18. A heat absorbing part of the Peltier device 13 is in thermal contact with the rear surface of the wiring board 12. That is, heat is conducted from the rear surface of the wiring board 12 to the heat absorbing part of the Peltier device 13. The wiring board 12 and the heat absorbing part of the Peltier device 13 may be in direct contact with each other or a thermally conductive material may be interposed between them. The heat releasing part of the Peltier device 13 is opposed to the inner surface of the base 16.

The radiation detector 1 further includes a cold finger (thermally conductive part) 14 which is in thermal contact with the heat releasing part of the Peltier device 13. The cold finger 14 is made of a material with a higher thermal conductivity than that of the base 16, such as copper. The cold finger 14 is configured to include a plate-like part which is in thermal contact with the heat releasing part of the Peltier device 13 and a bolt-like part protruding from the plate-like part toward the base 16. The bolt-like part of the cold finger 14 penetrates the base 16 and protrudes from the outer surface of the base 16. The plate-like part of the cold finger 14 has a size equal to or larger than that of the heat releasing part of the Peltier device 13. This enhances the heat releasing performance of the Peltier device 13 and facilitates positioning of the Peltier device 13 at the time of manufacturing the radiation detector 1. The heat releasing part of the Peltier device 13 and the plate-like part of the cold finger 14 may be in direct contact with each other or a thermally conductive material may be interposed between them. The bolt-like part of the cold finger 14 protruding from the outer surface of the base 16 is connected to the heat dissipating unit located outside the radiation detector 1. The heat dissipating unit is a heat sink, for example.

A low thermal conductivity part 15 is disposed between the base 16 and the cold finger 14. The low thermal conductivity part 15 is made of a low thermal conductivity material having a thermal conductivity lower than that of the base 16, such as ceramic. The low thermal conductivity part 15 is formed in, for example, an annular shape. Since the low thermal conductivity part 15 is provided, the base 16 is not in contact with the cold finger 14. Moreover, multiple lead pins 19 for applying voltage and input/output of signals penetrate the base 16.

The radiation detecting element 11 is cooled by the Peltier device 13 through the wiring board 12. The heat from the radiation detecting element 11 is conducted to the plate-like part of the cold finger 14 that is in thermal contact with the heat releasing part of the Peltier device 13, is conducted through the cold finger 14 to the heat dissipating unit connected to the bolt-like part of the cold finger 14, and is dissipated by the heat dissipating unit. That is, the heat from the radiation detecting element 11 is dissipated to the outside of the radiation detector 1 through the cold finger 14. As the cold finger 14 has a high thermal conductivity, the radiation detecting element 11 has high heat dissipating performance. In particular, the heat dissipating performance is enhanced compared to the conventional radiation detector that dissipates heat through a base. Moreover, as the low thermal conductivity part 15 is disposed between the base 16 and the cold finger 14, heat is not easily conducted from the base 16 to the cold finger 14. This suppresses the transfer of heat in the outside of the radiation detector 1 to the inside of the radiation detector 1 through the cover 17 and the base 16. This can therefore prevent the heat dissipating performance from lowering, which may be caused by the raise in temperature at the heat releasing part of the Peltier device 13 due to the transfer of external heat.

Moreover, as the low thermal conductivity part 15 is disposed between the base 16 and the cold finger 14, heat is not easily conducted from the cold finger 14 to the base 16. This suppresses the transfer of heat from the cold finger 14 to the radiation detecting element 11 through the base 16 and the cover 17. Therefore, heat is efficiently dissipated from the radiation detecting element 11 through the cold finger 14.

As described above, according to the present embodiment, the radiation detecting element 11 has high heat dissipating performance. Because of the high heat dissipating performance, the radiation detecting element 11 is sufficiently cooled and the leak current is reduced. Accordingly, the radiation detector 1 can detect radiation with high energy resolution, allowing the radiation detection apparatus to detect radiation with high sensitivity. The high heat dissipating performance may suppress the power required for the Peltier device 13 to cool the radiation detecting element 11, allowing the radiation detection apparatus to have low power consumption.

Embodiment 2

Figure 3:
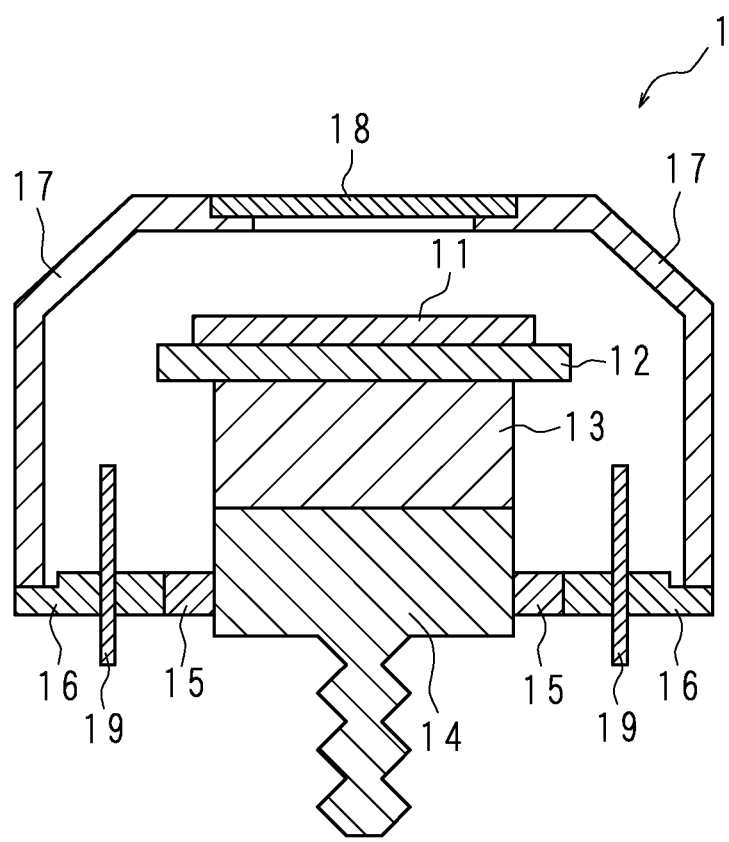
FIG. 3 is a schematic section view of a radiation detector according to Embodiment 2.

FIG. 3 is a schematic section view of the radiation detector 1 according to Embodiment 2. The plate-like part of the cold finger 14 penetrates the base 16 and protrudes from the outer surface of the base 16. The bolt-like part of the cold finger 14 protrudes from the plate-like part toward the outside of the radiation detector 1. Therefore, the cold finger 14 has a larger part penetrating the base 16 compared to Embodiment 1. A low thermal conductivity part 15 is disposed between the base 16 and the cold finger 14. The other components of the radiation detector 1 are similar to those in Embodiment 1. The other components of the radiation detection apparatus are also similar to those in Embodiment 1. Further in the present embodiment, the heat from the radiation detecting element 11 is conducted from the heat releasing part of the Peltier device 13 to the cold finger 14, and is dissipated through the cold finger 14 to the outside of the radiation detector 1. Compared to Embodiment 1, there are more paths for heat conduction through the cold finger 14, and the radiation detecting element 11 has higher heat dissipating performance.

Further in the present embodiment, the radiation detecting element 11 has high heat dissipating performance and the leak current in the radiation detecting element 11 is reduced. This allows the radiation detector 1 to detect radiation with high energy resolution and the radiation detection apparatus to detect radiation with high sensitivity. Moreover, the power required for the Peltier device 13 may be suppressed, thereby suppressing power consumption in the radiation detection apparatus.

Embodiment 3

Figure 4:
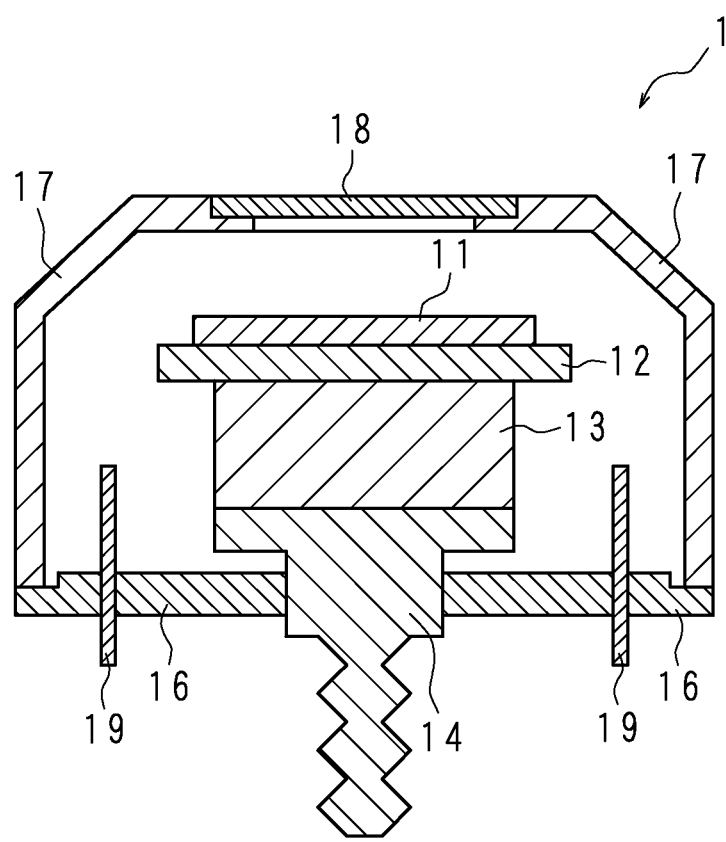
FIG. 4 is a schematic section view of a radiation detector according to Embodiment 3.

FIG. 4 is a schematic section view of the radiation detector 1 according to Embodiment 3. In the present embodiment, the radiation detector 1 is not provided with a low thermal conductivity part 15. The base 16 is made of a material with a thermal conductivity lower than that of iron, and is in contact with the cold finger 14. An intervening material may be interposed between the base 16 and the cold finger 14. The other components of the radiation detector 1 are similar to those in Embodiment 1. The other components of the radiation detection apparatus are also similar to those in Embodiment 1.

Further in the present embodiment, the radiation detecting element 11 is cooled by the Peltier device 13 through the wiring board 12, the heat from the radiation detecting element 11 is conducted from the heat releasing part of the Peltier device 13 to the cold finger 14, and is dissipated through the cold finger 14 to the outside of the radiation detector 1. As the cold finger 14 has high thermal conductivity, the radiation detecting element 11 has high heat dissipating performance. Moreover, the base 16 has low thermal conductivity, which makes it difficult for the heat to be conducted from the base 16 to the cold finger 14. This suppresses the transfer of heat in the outside of the radiation detector 1 to the inside of the radiation detector 1 through the cover 17 and the base 16. Accordingly, lowering of the heat dissipating performance can be prevented.

Moreover, as the base 16 has low thermal conductivity, heat is not easily conducted from the cold finger 14 to the base 16. This suppresses the transfer of heat from the cold finger 14 to the the radiation detecting element 11 through the base 16 and the cover 17. Therefore, heat is efficiently dissipated from the radiation detecting element 11 through the cold finger 14.

As described above, according to the present embodiment, the radiation detecting element 11 has high heat dissipating performance and the leak current in the radiation detecting element 11 is reduced. This allows the radiation detector 1 to detect radiation with high energy resolution and the radiation detection apparatus to detect radiation with high sensitivity. Moreover, the power required for the Peltier device 13 may be suppressed, thereby suppressing power consumption in the radiation detection apparatus.

Embodiment 4

Figure 5:
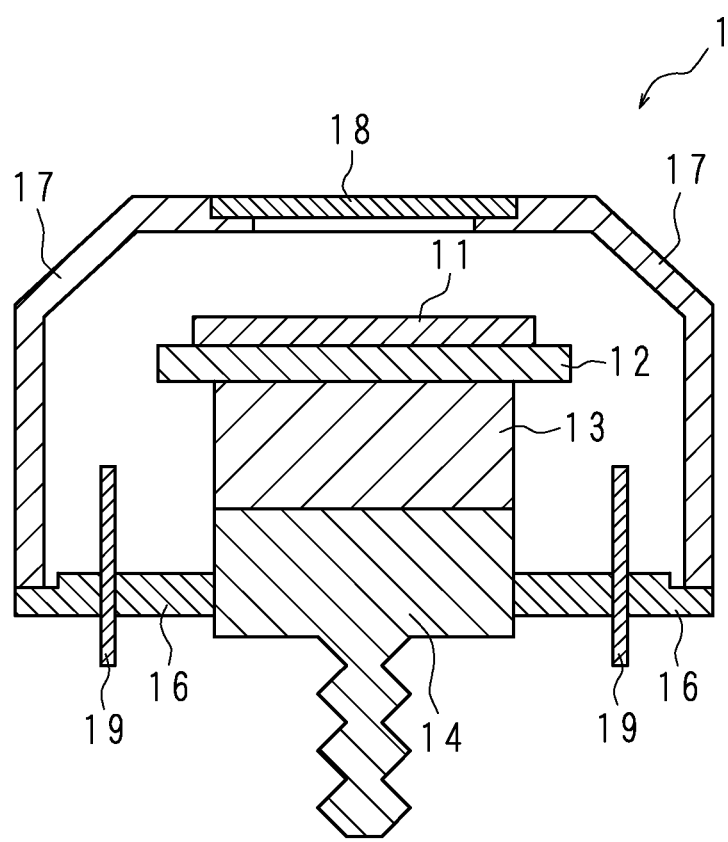
FIG. 5 is a schematic section view of a radiation detector according to Embodiment 4.

FIG. 5 is a schematic section view of the radiation detector 1 according to Embodiment 4. The plate-like part of the cold finger 14 penetrates the base 16 and protrudes from the outer surface of the base 16. The bolt-like part of the cold finger 14 protrudes from the plate-like part toward the outside of the radiation detector 1. Therefore, the cold finger 14 has a larger part penetrating the base 16 compared to Embodiment 3. The other components of the radiation detector 1 are similar to those in Embodiment 3. The other components of the radiation detection apparatus are also similar to those in Embodiment 1. Compared to Embodiment 3, there are more paths for heat conduction through the cold finger 14, and the radiation detecting element 11 has higher heat dissipating performance.

Further in the present embodiment, the radiation detecting element 11 has high heat dissipating performance and the leak current in the radiation detecting element 11 is reduced. This allows the radiation detector 1 to detect radiation with high energy resolution and the radiation detection apparatus to detect radiation with high sensitivity. Moreover, the power required for the Peltier device 13 may be suppressed, thereby suppressing power consumption in the radiation detection apparatus.

The radiation detection apparatus may take a form of scanning the surface of the sample 6 with radiation from the radiation source 4 to obtain the distribution of radiation spectra on the sample 6. Moreover, the radiation detection apparatus may take a form where the sample 6 is mounted on a sample table 5 with a hole, radiation is directed to the sample 6 from the lower side of the sample table 5, and radiation from the sample 6 is detected. Furthermore, the radiation detection apparatus may take such a form of not being provided with a function of emitting radiation and of detecting radiation entering from the outside with the use of the radiation detector 1.

It is noted that, as used herein and in the appended claims, the singular forms "a", "an", and "the" include plural referents unless the context clearly dictates otherwise.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A radiation detector, comprising:
    a radiation detecting element;
    an electronic cooling unit for cooling the radiation detecting element;
    a housing in which the radiation detecting element and the electronic cooling unit are accommodated; and
    a thermally conductive part which is in thermal contact with a heat releasing part of the electronic cooling unit,
    wherein the thermally conductive part is made of a material with a thermal conductivity higher than a thermal conductivity of the housing, and penetrates the housing so that a part of the thermally conductive part protrudes to an outside of the housing,
    the thermally conductive part includes a contacting part which is in thermal contact with the heat releasing part and a connection part configured to be connected to a part outside the radiation detector to transfer heat from the contacting part to the part outside the radiation detector, and
    the contacting part is larger than the connection part along a direction crossing a direction in which the thermally conductive part penetrates the housing.

2. The radiation detector according to claim 1, further comprising:
    a low conductivity material having a thermal conductivity lower than the thermal conductivity of the housing, which is disposed between the housing and the thermally conductive part.

3. The radiation detector according to claim 1, wherein:
    a portion of the housing that is in contact with the thermally conductive part is made of a material with a conductivity lower than a conductivity of iron.

4. A radiation detection apparatus, comprising:
    the radiation detector according to claim 1 that outputs a signal in accordance with energy of detected radiation; and
    a signal processing unit for generating a spectrum of the radiation based on a signal output by the radiation detector.

* * * * *